United States Patent
Maneatis

(10) Patent No.: US 6,710,670 B2
(45) Date of Patent: Mar. 23, 2004

(54) SELF-BIASING PHASE-LOCKING LOOP SYSTEM

(75) Inventor: John George Maneatis, Redwood City, CA (US)

(73) Assignee: True Circuits, Inc., Los Altos, CA (US)

( * ) Notice: Subject to any disclaimer, the term of this patent is extended or adjusted under 35 U.S.C. 154(b) by 153 days.

(21) Appl. No.: 10/059,503

(22) Filed: Jan. 28, 2002

(65) Prior Publication Data

US 2002/0101292 A1 Aug. 1, 2002

Related U.S. Application Data

(60) Provisional application No. 60/264,563, filed on Jan. 26, 2001, provisional application No. 60/264,628, filed on Jan. 26, 2001, provisional application No. 60/266,009, filed on Feb. 2, 2001, provisional application No. 60/316,702, filed on Aug. 31, 2001, and provisional application No. 60/316,703, filed on Aug. 31, 2001.

(51) Int. Cl.$^7$ ................................. H03B 5/00
(52) U.S. Cl. ....................... 331/185; 331/16; 331/17; 331/186
(58) Field of Search ............................ 331/16, 17, 185, 331/186

(56) References Cited

U.S. PATENT DOCUMENTS 6,566,970 B2 * 5/2003 Ingino, Jr. .................. 331/17

FOREIGN PATENT DOCUMENTS

JP  2002217721  * 8/2002

OTHER PUBLICATIONS

Delmot et al. "A Fully–Configurable GSM BTS Controller and GMSK–EDGE base band transmiter IC" IEEE Solid–State Conference Feb. 5–7, 2001 pp 352–353.*

* cited by examiner

Primary Examiner—Michael B Singleton
(74) Attorney, Agent, or Firm—Kolisch Hartwell, P.C.

(57) ABSTRACT

A phase-locked loop configured to cause an output signal to tend toward a desired output frequency based on an applied reference signal. In a first configuration, the phase-locked loop includes a voltage controlled oscillator operatively coupled with a bias generator. The voltage controlled oscillator is configured to produce the output signal in response to a VCO current generated via application of a biasing signal from the bias generator. The VCO current produces a regulated VCO voltage within the voltage controlled oscillator, and the bias generator is configured so that the regulated bias generator voltage matches the regulated VCO voltage free of any direct coupling between the bias generator and the regulated VCO voltage. In another configuration, the phase-locked loop includes a charge pump system having semiconductor components that correspond to only a portion of a voltage controlled oscillator associated with the loop. The semiconductor components are selected to provide the charge pump system with an effective impedance that is matched to an effective impedance of the voltage controlled oscillator. According to this aspect of the invention, the phase-locked loop further includes a bias generator configured to use the effective charge pump impedance to bias the charge pump system and thereby produce within the charge pump system a charge pump current of equal density to a VCO current used to drive the voltage controlled oscillator. In other configurations, the phase-locked loop includes isolated charge pumps and/or a charge pump configured to provide a spread spectrum output.

42 Claims, 10 Drawing Sheets

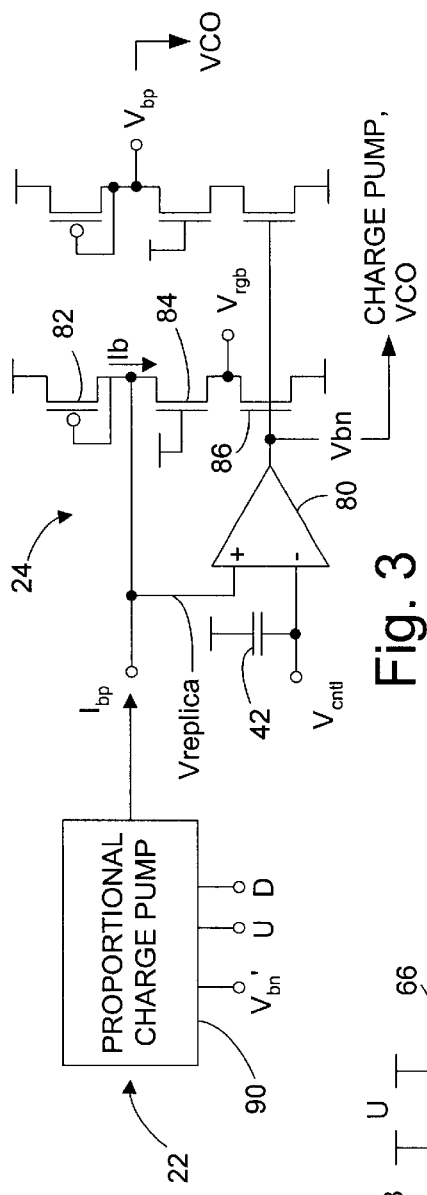
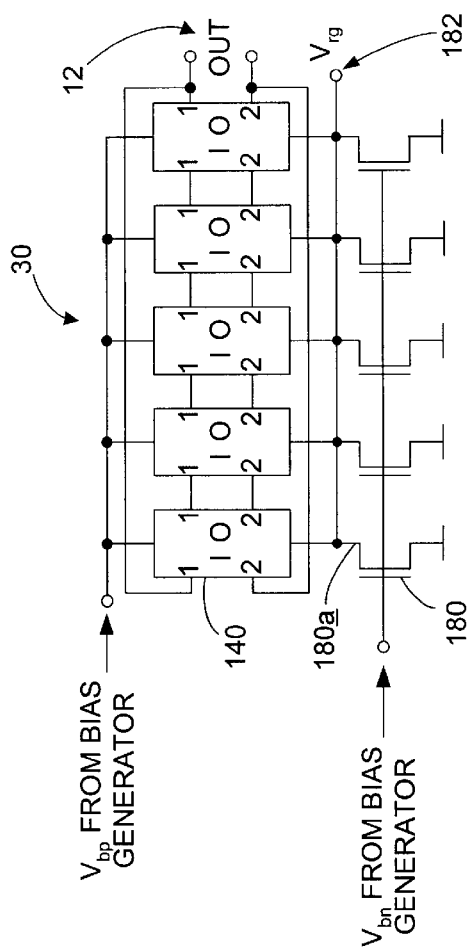
Fig. 3
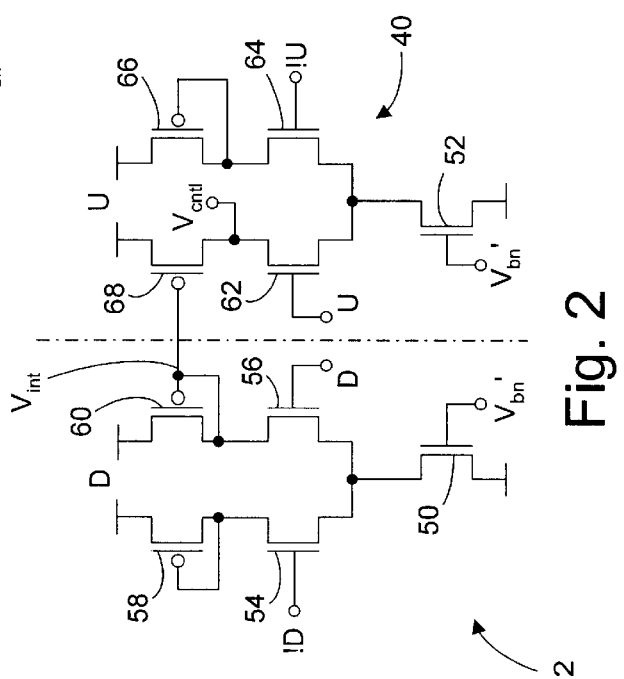
Fig. 4
Fig. 2

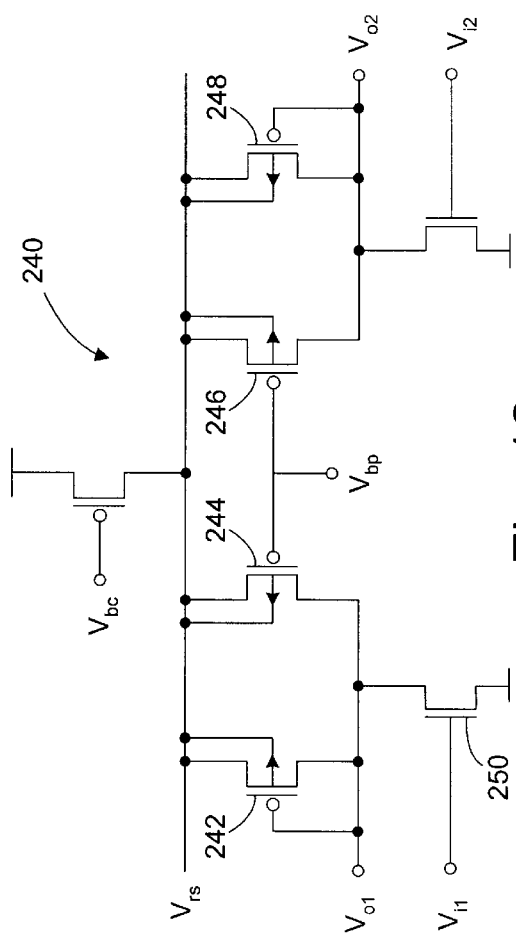
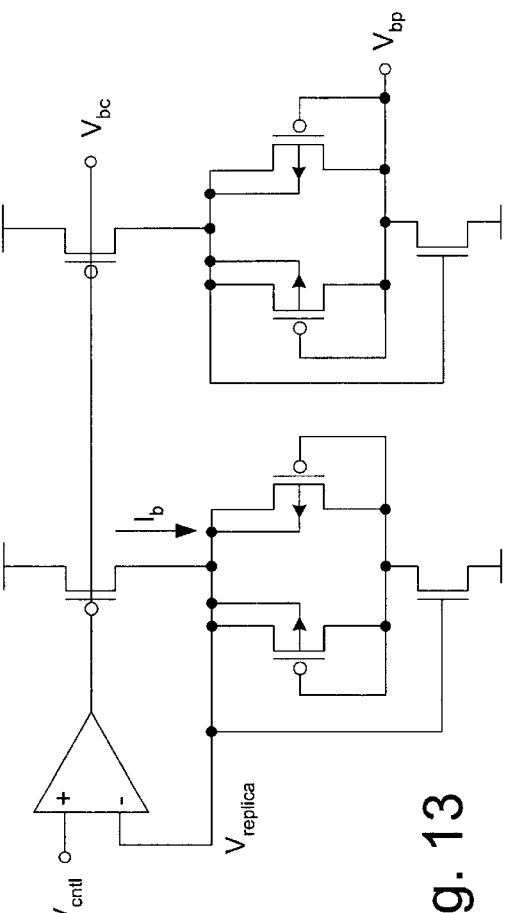
Fig. 12
Fig. 13

SELF-BIASING PHASE-LOCKING LOOP SYSTEM

CROSS-REFERENCE TO RELATED APPLICATIONS

This application is based upon and claims priority under 35 U.S.C. § 119 from the following co-pending U.S. provisional patent applications, each of which is incorporated herein by this reference, in its entirety and for all purposes: "Single-ended Zero Static Phase Offset Phase Locked Loops," Ser. No. 60/264,563, filed Jan. 26, 2001; "Multistage Programmable Current Mirrors," Ser. No. 60/264,628, filed Jan. 26, 2001; "Single-ended Zero Static Phase Offset Phase Locked Loops," Ser. No. 60/266,009, filed Feb. 2, 2001; "Pseudo-differential Zero Static Phase Offset Phase Locked Loops," Ser. No. 60/316,702, filed Aug. 31, 2001; and "Multistage Programmable Current Mirrors," Ser. No. 60/316,703, filed Aug. 31, 2001.

TECHNICAL FIELD

The present invention relates to feedback systems used in self-biasing phase-locked loops, and more particularly to self-biasing phase-locked loops employing VCO-matched bias generators, isolated charge pumps, and spread spectrum frequency output.

BACKGROUND OF THE INVENTION

Phase-locked loop (PLL) systems are used extensively in analog and digital circuits. These systems typically include a phase frequency detector (PFD), charge pump and voltage controlled oscillator (VCO) connected in a feedback configuration. The VCO produces the output signal of the PLL, and the various components of the PLL cooperate to cause the output signal to tend toward and eventually lock on to a desired output frequency, which is based on a reference signal applied as an input to the PFD. For example, many PLL systems are configured to produce an output signal having the same frequency as the input signal, or having an output frequency which is a factor x/y of the input frequency.

The output signal tracks the desired output frequency through operation of a feedback mechanism, in which the output of the VCO is fed back to the PFD as a feedback signal via a feedback path. The phase frequency detector receives the reference signal and the feedback signal, and produces an error signal based on discrepancies between the actual phase and frequency of the output signal and the desired phase and frequency. The error signals from the PFD are applied to the charge pump, which in turn produces signals that control the oscillation frequency of the VCO.

Minimizing or reducing uncontrolled jitter in the output signal is an important design issue in PLL systems. Jitter is variation in the phase and/or frequency of the output signal when the system is aligned or very nearly aligned. Most PLL systems exhibit some amount of jitter in the output signal. Indeed, many PLL systems have what is known as a "dead band," or a range of output alignments through which the system exerts little or no control over the output signal. This problem is addressed in some designs through phase frequency detectors configured to generate simultaneous canceling error signals when the system is in lock. Although this solution can reduce jitter, conventional implementations tend to introduce static phase offsets in the output signal, that is, an average phase discrepancy between the output signal and the desired phase.

In addition to the above problems, many existing PLL systems have other shortcomings which can have undesirable affects on the PLL output signal. For example, some systems suffer from undesired signal coupling between the various PLL components, which can lead to noise or jitter in the output signal. In other designs, the VCO and other PLL components are susceptible to voltage variations or noise coupled into the system from the voltage supply or other sources.

In addition, conventional phase-locked loops typically include components designed to operate under fixed or relatively fixed conditions. This can reduce the flexibility of the design, and constrain its use to a limited range of applications. For example, many PLL systems are designed for frequency multiplication by a predetermined scale factor, and are not easily modified for multiplication by other scale factors. In many cases, this inflexibility is the result of components that are designed to operate under fixed bias conditions.

SUMMARY OF THE INVENTION

The present invention provides a phase-locked loop configured to cause an output signal to tend toward a desired output frequency based on an applied reference signal. According to one aspect of the invention, the phase-locked loop includes a voltage controlled oscillator operatively coupled with a bias generator. The voltage controlled oscillator is configured to produce the output signal in response to a VCO current generated via application of a biasing signal from the bias generator. The VCO current produces a regulated VCO voltage within the voltage controlled oscillator. The bias generator is configured so that the regulated bias generator voltage matches the regulated VCO voltage free of any direct coupling between the bias generator and the regulated VCO voltage.

According to another aspect of the present invention, the phase-locked loop includes a charge pump system having semiconductor components that correspond to only a portion of a voltage controlled oscillator associated with the loop. The semiconductor components are selected to provide the charge pump system with an effective impedance that is matched to an effective impedance of the voltage controlled oscillator. According to this aspect of the invention, the phase-locked loop further includes a bias generator configured to use the effective charge pump impedance to bias the charge pump system and thereby produce within the charge pump system a charge pump current of equal density to a VCO current used to drive the voltage controlled oscillator.

According to yet another aspect of the invention, the phase-locked loop includes a charge pump that is biased with a biasing signal applied to the charge pump via an isolated bias input path, to prevent undesired signal coupling between the charge pump and other components of the phase-locked loop.

According to further aspects of the invention, the phase-locked loop may be variously configured to employ charge pumps providing output to an isolated output path, and/or to provide an output signal exhibiting spread spectrum behavior.

BRIEF DESCRIPTION OF THE DRAWINGS

FIG. 2 depicts a charge pump that may be implemented with the system of FIG. 1.

FIG. 3 depicts a charge pump and bias generator that may be implemented with the system of FIG. 1.

FIG. 4 depicts a multistage voltage controlled oscillator that may be implemented with the system of FIG. 1.

FIGS. 12 and 13 respectively depict an alternate oscillator stage and bias generator that may be employed with the system of FIG. 1.

DETAILED DESCRIPTION OF THE INVENTION

Figure 1:
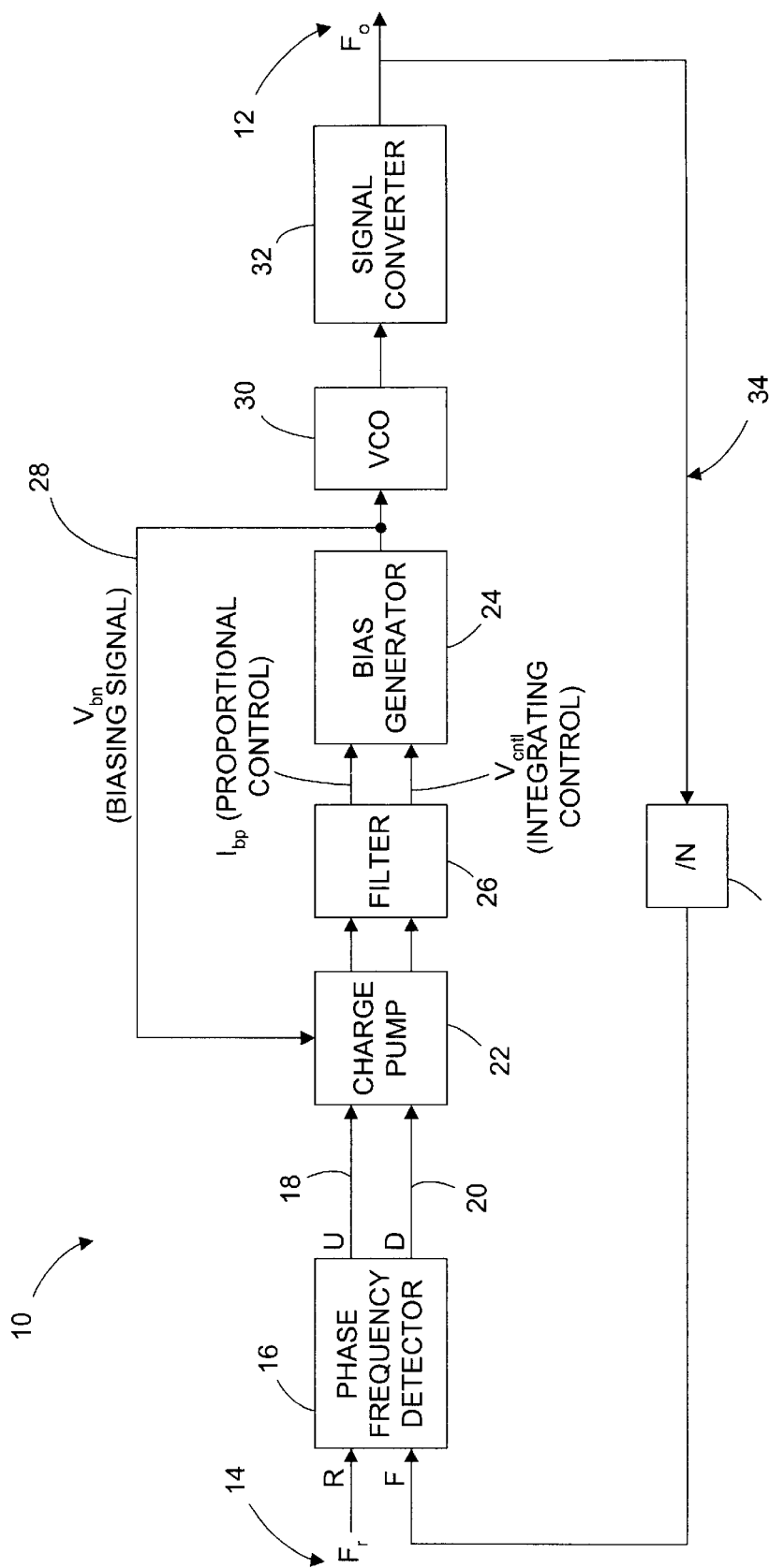
FIG. 1 is a block diagram of a phase-locked loop system according to the invention.

A phase-locked loop (PLL) system is depicted generally at 10 in FIG. 1. PLL system 10 is configured to produce an output signal 12 ($F_o$) in response to application of a reference signal 14 ($F_r$), such that the output signal tends toward a desired output frequency which is based on reference signal 14. For example, the output signal may have the same frequency as the input reference signal, or the output frequency may be a rational factor x/y of the reference frequency.

As indicated, PLL system 10 operates via a feedback arrangement, where output signal 12 is fed back and applied as a feedback input F to an error detector. The present invention will be described primarily in the context of phase-locked loops which implement the error detector as a phase frequency detector (PFD) 16. It will be appreciated, however, that the present invention is applicable to a wide variety of settings where error detection and feedback mechanisms are employed to cause an output signal to have a desired characteristic. For example, other types of error detectors with which the present invention may be used include XOR devices, mixers, edge-triggered latches and sampling flip-flops.

Still referring to FIG. 1, PFD 16 also receives reference signal 14 as a reference input R. PFD 16 detects phase/frequency differences between the signals applied to the reference and feedback inputs, and produces one or more outputs based on the detected differences. Typically, as indicated, the PFD output will take the form of a "U" signal 18, a "D" signal 20, or a combination of those signals. PFD 16 produces the U signal where the actual, or instantaneous, output frequency is lower than the desired output frequency, and/or where the output signal lags the desired output in phase. The D signal is produced where the actual output frequency is higher than the desired output frequency, and/or where the output signal leads the desired output in phase.

PLL system 10 typically also includes a charge pump system 22, bias generator 24 and one or more filters such as low pass filter 26. These components respond to the U and D signals to produce a control signal 28 ($V_{bn}$) that is applied to control a voltage controlled oscillator (VCO) 30. $V_{bn}$ may also be referred to as a biasing signal, because it typically is used to control various current sources and other components in the phase-locked loops of the present invention. For example, as depicted, $V_{bn}$ may be fed back to charge pump system 22 to dynamically bias operation of the charge pump, as will be explained in more detail. Based on application of biasing signal $V_{bn}$, VCO 30 produces output signal 12, either directly or with subsequent processing by signal converter 32 or other components.

For example, in an implementation where output signal 12 ($F_o$) is to track reference signal 14 ($F_r$) without frequency multiplication or division, assume at a given instant that output signal 12 has a lower frequency than the applied reference signal 14. PFD 16 detects this difference and responds by producing one or more U pulses 18. The U pulses then cause a change in biasing signal 28 (resulting, for example, in an increase in current supplied to VCO 30) that produces an increase in the phase and/or frequency of the VCO output signal $F_o$. The charge pump continues to output U pulses until the output frequency equals the reference frequency.

As indicated, output signal 12 may undergo various processing within feedback path 34 before being applied as the feedback input to PFD 16. For example, in PLL applications where the reference frequency is multiplied by a factor to produce the output frequency, the feedback path typically will include a divider 36 and/or other components.

FIGS. 2, 3 and 4 respectively depict in further detail charge pump system 22, bias generator 24 and VCO 30 according to the present invention. Charge pump system 22 typically includes an integrating charge pump 40 configured to provide output to the $V_{cntl}$ node of bias generator 24 in response to error signals received from PFD 16 (i.e., U and/or D pulses). The level of $V_{cntl}$ is maintained at the input of bias generator 24 via capacitor 42. Charge pump 40 causes the $V_{cntl}$ level to increase, decrease or remain constant based on the U and D signals applied from PFD 16. Based on $V_{cntl}$, bias generator 24 produces biasing signal $V_{bn}$, which is applied to the current sources that drive charge pump 40 and VCO 30. At charge pump 40, biasing signal $V_{bn}$ essentially controls the sensitivity of the charge pump to the U and D signals. In other words, the biasing signal controls the extent to which application of these signals causes the $V_{cntl}$ output to vary. At VCO 30, biasing signal $V_{bn}$ acts as the primary input to the oscillator, and controls its output frequency.

As seen in FIGS. 1 and 2, PFD 16 typically includes separate output lines for the U and D signals. Accordingly, charge pump 40 may include a U portion and a D portion configured to receive the corresponding error signals from the PFD. Each portion contains one or more current paths which are controlled by biasing signal $V_{bn}$ and through application of the error signals received from PFD 16. The currents flowing through the paths create various node voltages which ultimately determine the behavior of the control signal $V_{cntl}$.

Referring particularly to FIG. 2, transistors 50 and 52 act as current sources. These transistors are biased by $V_{bn}'$, a mirrored copy of biasing signal $V_{bn}$, as will be explained below. Transistors 54 and 56 steer current into one of two diode-connected transistors 58 and 60, and transistors 62 and 64 steer a matched current into the depicted $V_{cntl}$ terminal, or into diode-connected transistor 66. The current mirror formed by transistors 60 and 68 sources as much charge into $V_{cntl}$ as is drained through transistor 60, subject to certain limitations discussed below. Because transistors 54, 56, 62 and 64 control activation of the various current paths within the charge pump in response to the U and D error signals, those transistors may be collectively referred to as a switching device.

From the above, it should be understood that application of the U signal from PFD 16 causes $V_{cntl}$ to fall, while application of the D signal causes $V_{cntl}$ to rise. As will be explained in more detail, decreases in $V_{cntl}$ produce an increase in biasing signal $V_{bn}$ and an increased bias current $I_b$ within bias generator 24 (FIG. 3). The increase in biasing signal $V_{bn}$ causes the current supplied to VCO 30 to rise. This increased VCO current produces positive phase and/or frequency adjustments to output signal 12. Conversely, when $V_{cntl}$ increases (e.g. from pulsing of the D signal), the bias current $I_b$ and biasing signal $V_{bn}$ drop. This decreases the current supplied to VCO 30, which in turn produces negative adjustment to the phase and/or frequency of output signal 12.

In typical implementations of the present invention, the error signals output by PFD 16 tend to have a stabilizing effect upon the output signal when the system is in lock. Conversely, in the absence of either a U or a D signal (as might occur if little or no discrepancy were detected between the two signals applied to the inputs of PFD 16), output signal 12 tends to drift about the desired output frequency instead of achieving a stable lock. The range of alignments in which this drift effect occurs is known as a "dead band." The dead band results partly from the narrowing of the U and D pulses as the system approaches lock. Narrower pulses are often filtered out by various components in the system, such that the system is unable to correct discrepancies between the output signal and the desired output frequency until those discrepancies exceed some threshold magnitude. The resulting output jitter is often undesirable.

To eliminate or reduce this undesired jitter in the output signal, PFD 16 may be configured to emit both U and D pulses when the PFD inputs are aligned or nearly aligned. When only one of the signals is applied, charge pump system 22 pumps a net charge to bias generator 24, in order to produce variation in the phase and/or frequency of the output signal. By contrast, where both the U and D signals are applied together (simultaneously) to charge pump 40, the charge pump should pump no net charge.

Typically, when U and D are pulsed simultaneously to avoid a dead band, the respective effects of those error signals are at least partially canceled via operation of the current mirror defined by transistors 60 and 68 (FIG. 2). Theoretically, the current mirror ensures that the current through transistors 60 and 68 will be equal, leaving no net output charge from charge pump 40, and ensuring no variation of the $V_{cntl}$ level on capacitor 42. If a net charge were pumped in such a situation, the variation in $V_{cntl}$ would introduce an undesired variation in output signal 12. Specifically, such charge leakage can produce undesired static phase offset in output signal 12.

The current through transistors 60 and 68 would be equal if charge pump 40 contained an ideal current mirror and two ideal switchable current sources with infinite output impedance. However, these devices typically are not ideal in practice, and the phase-locked loops described herein normally include some mechanism to force the voltage $V_{cntl}$ to equal the $V_{int}$ gate voltage on transistor 60. This causes the charge pump output current to be zero when U and D are asserted, leaving no net effect upon the $V_{cntl}$ voltage stored on capacitor 42.

Bias generator 24 dynamically varies its output biasing signal $V_{bn}$ in order to balance the charge pump output when U and D signals are simultaneously applied to charge pump 40. As the current being steered through transistor 60 grows larger, the voltage on $V_{int}$ grows smaller. Bias generator 24 is configured to find and supply a $V_{bn}$ level for which the voltage $V_{int}$ will equal the voltage $V_{cntl}$. Bias generator 24 contains an amplifier 80 and a replica of the current path through the D side of charge pump 40 when the D signal is pulsed. The replica current path includes transistors 82, 84 and 86. The negative feedback through the amplifier causes $V_{replica}$ to be equal to $V_{cntl}$ by appropriately adjusting the biasing current $I_b$ set by $V_{bn}$.

With both U and D high, the activated current path on the left side of the charge pump will look identical to the replica current path within bias generator 24, so that $V_{int}$ will equal $V_{replica}$, which the bias generator forces to equal $V_{cntl}$. The right side of charge pump 24 is similar, but the gate of transistor 68 is not connected to its drain. However, like transistor 60, both the gate and drain voltages will be $V_{cntl}$. Thus, the right side of the charge pump should behave identically to the left side so that the current sourced by transistor 68 will exactly match the current sunk by transistor 62 leaving no net output current.

With no output current from the charge pump when both U and D are high, there should be no net charge output when U and D are pulsed identically, as would occur in a locked condition with zero static phase offset. Phase-locked loops with this arrangement may thus be considered self-biased phase-locked loops.

As should be appreciated from the above discussion, biasing signal $V_{bn}$ is dynamically generated free of any external bias levels. In addition to balancing operation of charge pump system 22, the biasing signal dynamically controls other current sources within phase-locked loop 10. Also, as will be explained in more detail, the dynamic operation of bias generator 24 causes the bias generator to internally generate a supply voltage which matches the supply voltage in VCO 30. Accordingly, the PLL systems of the present invention are dynamically self-biasing.

As indicated above, charge pump system 22 typically includes an integrating charge pump 40 to provide integrating control over output signal 12. In many cases, it will also be desirable to employ proportional control to achieve stable feedback. Accordingly, as seen in FIG. 3, charge pump system 22 may also include a proportional charge pump 90.

Typically, integrating charge pump 40 and proportional charge pump 90 are similar, if not identical, in construction and internal operation. Both pumps respond to the U and D error signals by pumping charge for application to bias generator 24, in order to produce adjustments to output signal 12. Also, both pumps are biased via feedback coupling of biasing signal $V_{bn}$ (or mirrored copy $V_{bn}'$) from bias generator 24.

The two charge pumps are distinguished by the signal path to bias generator 24, and by the way pumped charge is applied to the bias generator. Integrating charge pump 40 pumps its output charge along an integrating control path defined between $V_{cntl}$ node of charge pump 40 and the $V_{cntl}$ input terminal of bias generator 24. The pumped charge is integrated by and stored at capacitor 42. The voltage on this capacitor represents the net accumulated charge resulting from all of the previously applied U and D signals to integrating charge pump 40.

By contrast, proportional charge pump 90 pumps its output charge via a proportional control path to the $V_{replica}$ node of bias generator 24. The output charge typically is in the form of a current pulse $I_{bp}$ which is added to or subtracted from the $I_b$ bias current flowing within the replica current path in bias generator 24. In some cases, there may be various capacitances introduced into the proportional control path, though these capacitances typically are much smaller than capacitor 42. Accordingly, the proportional control provided by charge pump 90 normally involves small phase adjustments to output signal 12, where the integrating control provided by integrating charge pump 40 typically involves more gradual adjustments to the frequency of the output signal, due to the accumulated charge on capacitor 42 and the filtering effects produced by the relatively large capacitance.

Figure 5:
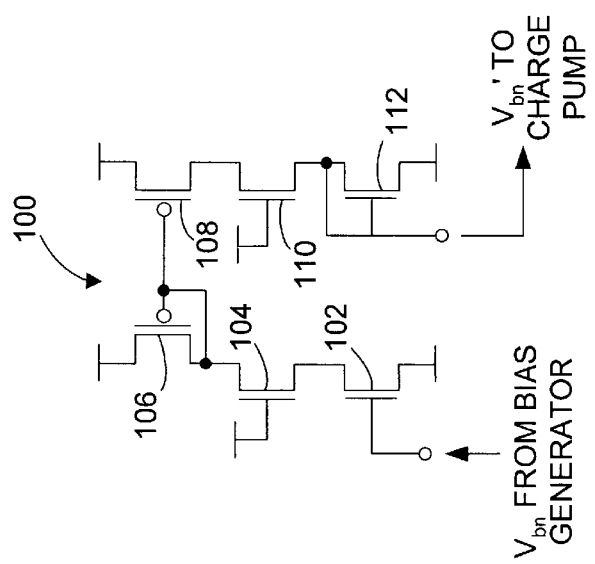
FIG. 5 depicts a circuit that may be implemented to isolate biasing signals within the charge pumps of the present invention.

As indicated above, when phase-locked loop 10 is in lock, PFD 16 emits small, equal-sized U and D pulses to charge pump system 22. These pulses can capacitively couple into biasing signal $V_{bn}$ through transistors 54, 56, 62, 64, 50 and 52 of integrating charge pump 40. Similar signal coupling can occur in proportional charge pump 90. The resulting periodic noise on biasing signal $V_{bn}$ may cause some cycle-to-cycle jitter, since the biasing signal is also used to drive VCO 30. As seen in FIG. 5, the charge pump system may include an isolated bias input path 100 to isolate biasing signal $V_{bn}$ and avoid the jitter described above.

As indicated in FIG. 5, isolated bias path 100 typically includes a number of transistors (e.g., transistors 102, 104, 106, 108, 110 and 112) which define a current mirror system. The current mirror system produces a mirrored copy $V_{bn}'$ of the $V_{bn}$ biasing signal generated by bias generator 24. The mirrored biasing signal $V_{bn}'$ is then used in the charge pumps, so that noise coupled onto it does not affect VCO 30. The left transistor stack essentially creates a local copy of a secondary biasing signal $V_{bp}$ generated by bias generator 24. (explained below) In some settings, it may be desirable to directly use the secondary biasing signal in the right transistor stack, instead of generating a local copy.

Co-pending U.S. patent application Ser. No.10/059,912, by John G. Maneatis, entitled "Programmable Current Mirror," filed on Jan. 28, 2002, provides additional examples of current mirroring devices that may be employed with the present invention. The disclosure of that application is incorporated herein by this reference, in its entirety and for all purposes.

As discussed above, bias generator 24 includes a feedback loop that actively tracks $V_{cntl}$ to generate a dynamic biasing signal which controls both the charge pump system 22 and VCO 30. For reasons explained below, it typically is important that this feedback loop exhibit a bandwidth response that is much faster than the overall bandwidth of the PLL system.

However, in some cases it will be desirable to couple components within the proportional control path (e.g., between proportional charge pump 90 and the $V_{replica}$ node of bias generator 24) that may affect the dynamic response of the bias generator feedback loop. Examples of such components may be found in co-pending U.S. patent application Ser. No. 10/059,945, by John G. Maneatis, entitled "Phase-Locked Loop with Conditioned Charge Pump Output," filed on Jan. 28, 2002, the disclosure of which is incorporated herein by this reference, in its entirety and for all purposes. The disclosure of this patent application describes components that may be coupled intermediate the charge pump system and bias generator in order to condition charge pump output for various reasons, for example in order to eliminate jitter in output signal 12.

Where these components are used, and in other cases, coupling proportional charge pump 90 and these components directly to bias generator 24 can increase the capacitance on $V_{replica}$. Large increases in this capacitance can destabilize the feedback loop within the bias generator. This can be countered with an increase in the capacitance on biasing signal $V_{bn}$, though such an increase would reduce the bandwidth of the bias generator, which in turn can reduce the supply and substrate noise rejection of the VCO, as will be explained below.

Figure 6:
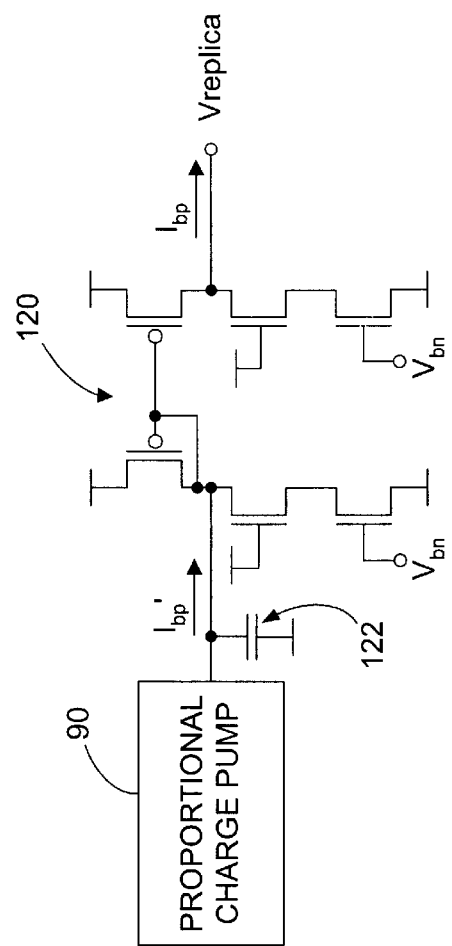
FIG. 6 depicts a current mirror system that may be employed within a proportional control path between the charge pumps and bias generators of the present invention.

These issues may be addressed by providing proportional charge pump 90 with an isolated output 120 within the proportional control path, as seen in FIG. 6. Isolated output 120 includes a number of transistors which define a current mirror system. The current mirror system is pre-biased by biasing signal $V_{bn}$ from bias generator 24, and replicates initial output $I_{bp}'$ (but with opposite sign), so that output $I_{bp}$ is applied to the $V_{replica}$ node of the bias generator, as discussed above with reference to FIG. 3. The U and D inputs may be reversed on the proportional charge pump to compensate for the change in sign. The depicted current mirror system isolates proportional charge pump 90 from bias generator 24. This allows use of an arbitrary capacitance 122, or other components in the proportional control path, without affecting damping, bandwidth or other dynamic characteristics of the feedback loop contained within bias generator 24. Further filtering and signal isolation may be provided by cascading additional stages to the depicted isolation circuit.

As discussed above, it typically is desirable that phase-locked loop 10 maintain a stable lock even when faced with rapid changes in supply voltage or noise coupled into the system from the substrate or other sources. The systems described herein substantially reject effects due to supply variations and substrate noise because bias generator 24 is configured to maintain a constant bias current $I_b$ during $V_{dd}$ changes, and the supply current to VCO 30 matches this current in the bias generator. VCO 30 thus operates at a constant current, and thus a constant operating frequency, through changes in the voltage supply.

Figure 8:
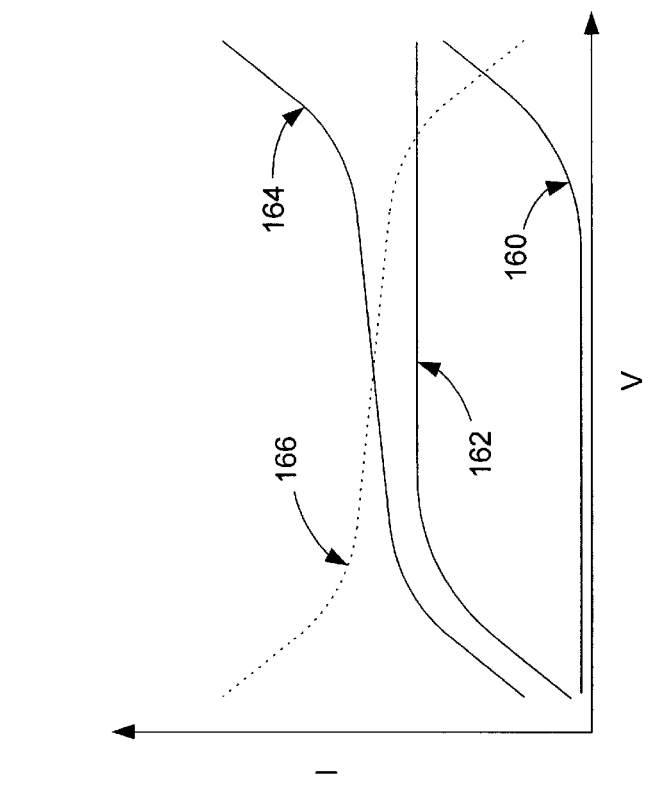
FIG. 8 depicts I–V characteristics of various components shown in FIG. 7.
Figure 7:
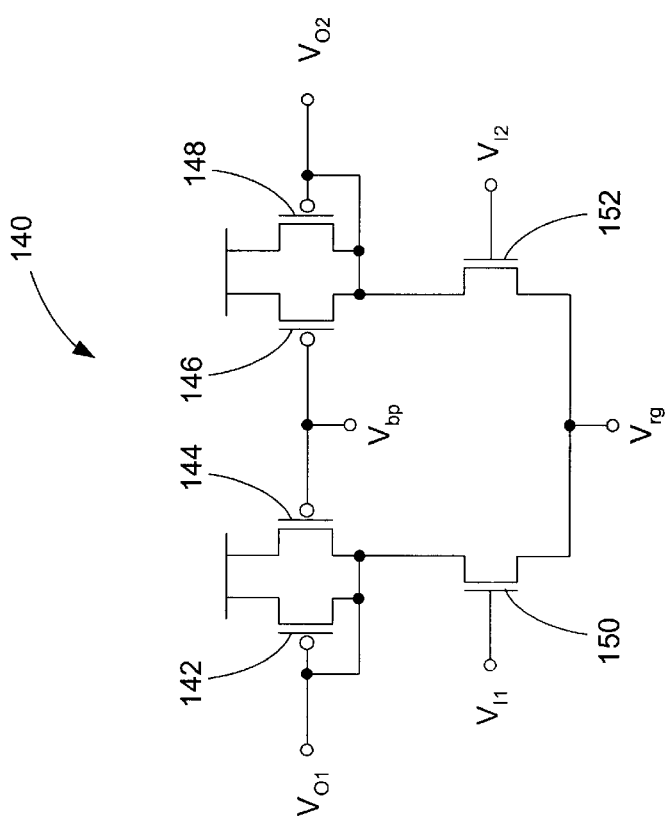
FIG. 7 depicts an illustrative oscillator stage that may be implemented with the system shown in FIG. 1.

As seen in FIG. 4, VCO 30 may include multiple VCO stages 140. FIG. 7 depicts an exemplary embodiment of one of VCO stages 140, and FIG. 8 depicts I–V characteristics of various elements in VCO stage 140. VCO stage 140 includes two load elements, one being formed by transistors 142 and 144, the other being formed by transistors 146 and 148. As indicated, transistor 142 typically is a diode-connected PMOS device, with an I–V characteristic as shown by curve 160 (FIG. 8). Transistor 144 is connected as a current source biased by $V_{bp}$ with an I–V characteristic as shown by curve 162. $V_{bp}$ is a secondary biasing signal that is produced by the bias generator, as seen in FIG. 3. The I–V characteristic of the two devices (i.e., transistors 142 and 144) in parallel is the sum of curves 160 and 162, shown as curve 164. Curve 164 is symmetrical about the voltage $(V_{bp}+V_{dd})/2$, which is also the center of the swing of the VCO stage inputs and outputs. Secondary biasing signal $V_{bp}$ varies with $V_{bn}$ to ensure that the VCO stage operates within a symmetrical region of the load element characteristic.

The second load element (i.e., the load element formed by transistors 146 and 148) has similar I–V characteristics. When the inputs to the two load elements are differential, the respective combined characteristics will be symmetrical and opposite, such that the second load element will have a combined characteristic as shown by dashed curve 166. As explained below, pseudo-differential configurations may be employed to ensure that the load element inputs are differential.

Figure 9:
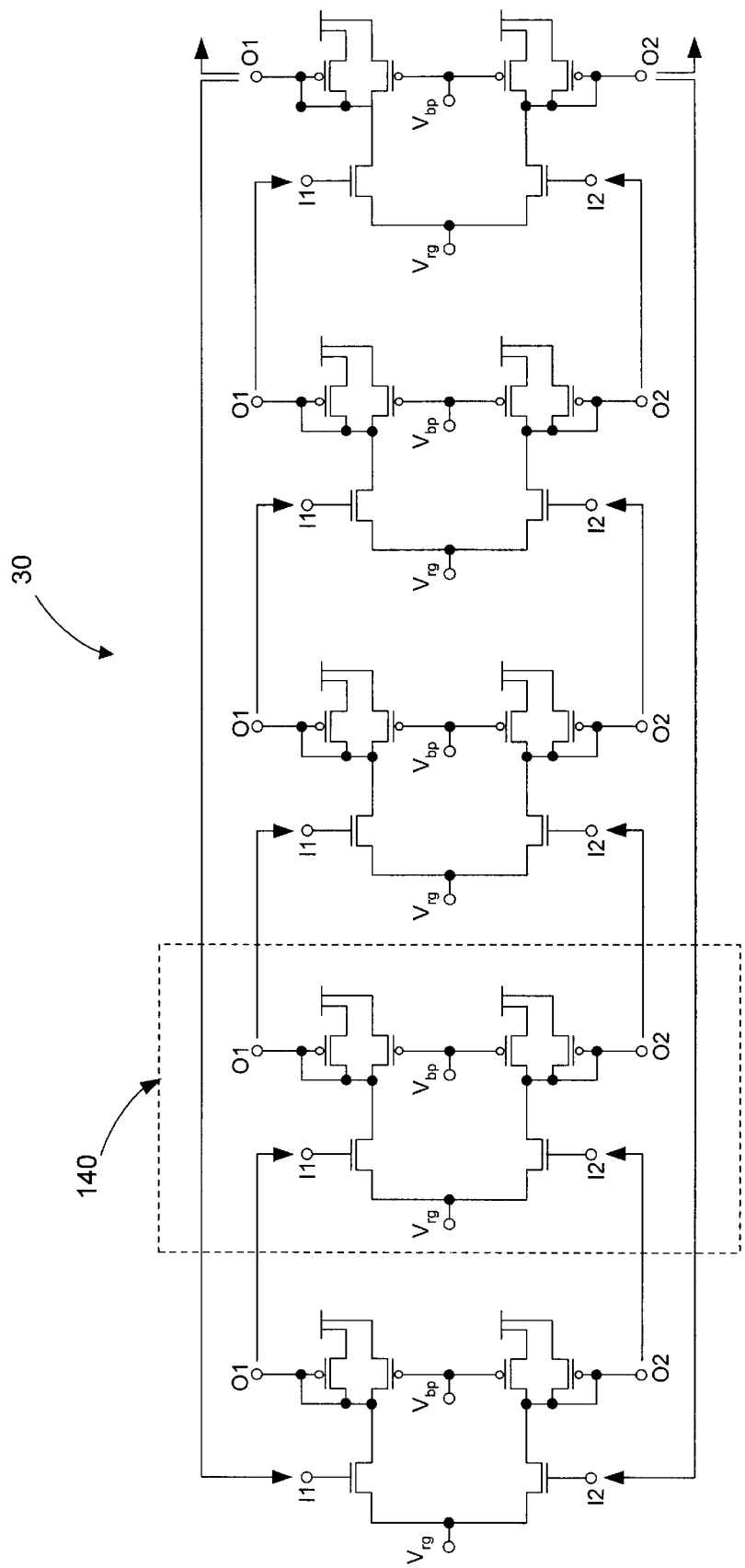
FIG. 9 depicts a multistage voltage controlled oscillator according to the invention.

Typically, each load element of VCO stage 140 is coupled in series with an input transistor, respectively shown as transistors 150 and 152. Provided the input signals $V_{i1}$ and $V_{i2}$ to VCO stage 140 are differential, outputs $V_{o1}$ and $V_{o2}$ will be differential. Because the I–V curves of each load element are symmetrical about the center of the voltage swing, the supply current and supply resistance through the VCO stage will be constant, provided the input signals are differential. As indicated in FIG. 4, VCO 30 typically includes multiple stages connected in cascade fashion as a ring oscillator, such that outputs $V_{o1}$ and $V_{o2}$ of a given stage feed inputs $V_{i1}$ and $V_{i2}$ of the next stage. FIG. 9 depicts in more detail the interconnections between VCO stages 140. It has been determined that employing five VCO stages provides a suitable oscillatory response, though it should be appreciated that more or less than five stages may be used, as appropriate to a given setting.

The semiconductor devices used to construct bias generator 24 and the individual VCO stages are closely matched in order to match impedances between the bias generator and VCO. Specifically, in the $I_b$ current path within bias generator 24, current source transistor 86 faces an effective bias generator impedance formed by transistors 82 and 84. In VCO stage 140, transistors 142, 144, 146, 148, 150 and 152 are configured to match this impedance within the bias generator. Thus, VCO current source transistor 180 (FIG. 4) and the bias generator current source 86 theoretically face matched (i.e., identical or scaled) impedances. Scaled matching may be desirable in cases where it is advantageous to scale down the bias generator, for example by employing devices with narrower channel widths. Accordingly, it will be appreciated that matching effective impedances between the bias generator and VCO typically involves ensuring that the current densities within the relevant portions of the components are the same. Despite the matching configuration described above, there may be periodic variations in the resistance of the individual VCO stages, as will be explained below. In addition, as discussed above, the bias generator and charge pump systems of the present invention typically are matched. Accordingly, various semiconductor components within the charge pumps of the present invention provide effective impedances which are matched to the effective impedances within the oscillator stages.

As best seen in FIG. 4, VCO stages 140 typically are connected together via a regulated voltage connection (e.g., regulated ground connection $V_{rg}$) in order to cancel period fluctuations in the resistance of individual VCO stages. This connection is employed because the I–V characteristics discussed above with reference to FIG. 8 may deviate somewhat from being perfectly symmetrical about the center voltage $(V_{dd}+V_{bp})/2$. This asymmetry may occur due to physical device mismatch and/or from variations in transistor dynamics from ideal transistor models. In addition, in some cases there will be asymmetry in the rise and fall times of the inputs to each VCO stage 140. These non-ideal conditions can produce periodic fluctuations in the resistance of each VCO stage. During operation, the voltage controlled oscillator establishes a regulated VCO voltage, which is defined between the positive voltage supply ($V_{dd}$) and the regulated voltage node ($V_{rg}$). As will be discussed below, the oscillator may be configured such that the regulated voltage node is established with a regulated supply connection $V_{rs}$, with the regulated VCO voltage then being defined between the negative voltage supply ($V_{ss}$) and the regulated voltage node $V_{rs}$.

The regulated ground connection discussed above is typically implemented by delivering current to the VCO stages through regulated voltage node $V_{rg}$. Referring still to FIG. 4, each VCO stage 140 is driven by a current source transistor 180 biased by biasing signal $V_{bn}$. The individual current source transistors 180 collectively form the current source which drives the voltage controlled oscillator. As indicated, the output terminals 180a of the current source transistors may be shorted together at regulated voltage node 182 ($V_{rg}$). VCO stages 140 are thus coupled in parallel between the current source and the supply voltage $V_{dd}$, with current being delivered to the stages through regulated voltage node 182. This regulated ground connection cancels any low frequency periodic variations in the resistance of each VCO stage, and the remaining variations are reduced in magnitude and restricted to higher harmonics of the VCO oscillation frequency. The total resistance between node 182 and $V_{dd}$ is thus more nearly constant than the resistance of any one VCO stage. This nearly constant resistance, in series with a current supply formed by transistors biased by $V_{bn}$, keeps the voltage drop $V_{dd}-V_{rg}$ (i.e., the regulated VCO voltage) very close to constant.

If the current sources and transistors connected to node 182 were linear, then the time average of $V_{rg}$ over each cycle would converge to $V_{rgb}$ in bias generator 24 (FIG. 3). These devices are not linear, and these non-linearities result in an offset between the time-averaged value of $V_{rg}$ and $V_{rgb}$. This offset is a function of $V_{dd}$. Reducing the amplitude of variation of $V_{rg}$ reduces the effects of these non-linearities and reduces the offset between $V_{rg}$ and $V_{rgb}$. Since the frequency generated by the VCO is a function of its supply current, which depends on the voltage drop from $V_{dd}$ to $V_{rg}$ (the regulated VCO voltage), cyclic variations of $V_{rg}$ ultimately lead to output jitter induced by supply noise, as explained below. The regulated connection discussed above minimizes these cyclic voltage variations.

Noise rejection in VCO 30 depends on a VCO current supply that remains undisturbed in the face of changes to $V_{dd}$ (or $V_{ss}$). The VCO current supply is controlled by bias generator 24, which in turn is controlled by the $V_{cntl}$ signal generated by charge pump system 22. Bias generator 24 is configured to reject supply noise by generating a constant bias current $I_b$ and an internal VCO supply voltage $V_{dd}-V_{rgb}$ (also referred to as the regulated bias generator voltage) which is matched to the VCO supply voltage $V_{dd}-V_{rg}$ (i.e., the regulated VCO voltage).

The feedback loop within the bias generator will adjust $V_{bn}$ so that $V_{replica}$ will match $V_{cntl}$. Diode-connected transistor 82 establishes a current based on its drain-to-source voltage bias. As long as the voltage between nodes $V_{dd}$ and $V_{replica}$ remains fixed, the current $I_b$ will remain fixed as well. $V_{cntl}$ is passively supply-referenced (to $V_{dd}$) through operation of capacitor 42, such that $V_{cntl}$ tracks variations in the supply voltage. Alternatively, $V_{cntl}$ may be supply-referenced to $V_{ss}$ or referenced to any other suitable reference value. $V_{replica}$ in turn is actively supply-referenced through operation of amplifier 80 and the other components of the feedback loop within bias generator 24. Accordingly, the drain-to-source voltage on transistor 82 is unaffected by supply voltage variation, so that biasing current $I_b$ is constant. Because bias generator 24 generates a bias current $I_b$ that is independent of $V_{dd}$ and a regulated bias generator voltage $V_{dd}$-$V_{rgb}$ that matches the regulated VCO voltage $V_{dd}$-$V_{rg}$, the current delivered through regulated node 182 to VCO stages 140 will be independent of $V_{dd}$. In other words, the current supplied to the VCO depends on the voltage difference between $V_{bn}$ and $V_{ss}$ (FIG. 3). The bias generator actively adjusts $V_{bn}$ in response to supply voltage changes to ensure that the biasing current $I_b$ (and thus, the VCO current) is independent of supply voltage changes. Accordingly, the oscillation frequency of VCO 30 is independent of supply voltage variations. As a result, the depicted exemplary embodiments of phase-locked loop 10 substantially reject noise coupled into the system from the supply, ground, substrate and other sources.

It will be appreciated that the noise rejection features discussed above typically depend on the bandwidth response of bias generator 24. Specifically, the bias generator must have enough bandwidth to make $V_{replica}$ track supply variations before they can have an impact on the output of VCO 30. An important advantage of the various PLL embodiments discussed herein is that the various components are designed to perform their respective functions without adversely affecting the bandwidth response of the bias generator. The noise rejection achieved by matching the bias generator to the regulated VCO supply voltage is implemented without any direct coupling of the bias generator to the regulated VCO supply voltage. This avoids adding capacitance to the bias generator feedback loop. This approach also makes it possible to precisely control the damping factor of the phase-locked loop through control of the gain of the proportional control path.

Figure 11:
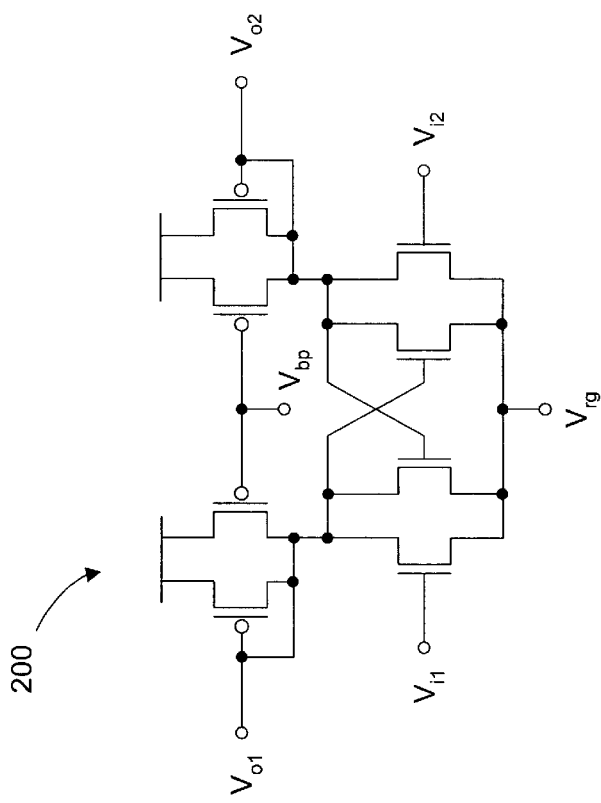
FIGS. 10 and 11 are depictions of a pseudo-differential oscillator stage that may be employed in the voltage controlled oscillators of the invention.
Figure 10:
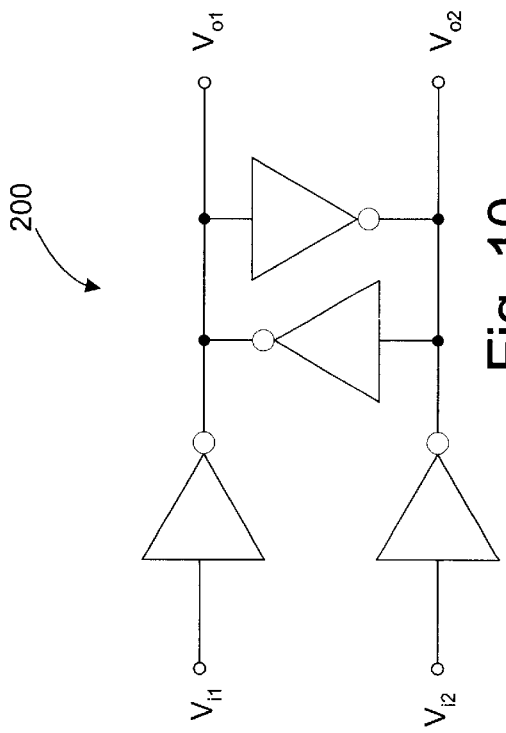

In many cases, it will be desirable to modify one or more of the VCO stages shown in FIGS. 4 and 9 so that the stages are pseudo-differential. For example, one stage may be replaced with a pseudo-differential stage such as that shown at 200 in FIG. 10. As indicated, pseudo-differential stage 200 is constructed from four single-ended stages. The transistor sizes within the crossed stages are typically smaller than the transistor sizes within the other stages. FIG. 11 is an expanded transistor-level representation of pseudo-differential stage 200. Where one of stages 140 (FIGS. 4 and 9) is modified with such a pseudo-differential configuration, the resulting VCO will include two independent oscillation rings. In many cases, this will stabilize oscillations and ensure that the signals on the two rings are synchronized and differential.

Some advanced CMOS fabrication processes use gate oxides so thin that they have a non-negligible gate current. Because of the current leakage, these transistors do not perform well as capacitors. However, phase-locked loops designed with these advanced processes may still require large capacitances, where the area of a metal layer and/or polysilicon capacitor is unwanted. In such cases, thick oxide transistors can be used for the loop filter capacitors (e.g., capacitor 42 in the integrating control path between integrating charge pump 40 and bias generator 24).

However, when thick oxide transistors are used in some advanced CMOS processes, the PMOS threshold voltage $V_{tp}$ may be greater than the control voltage $V_{cntl}$ for the phase-locked loop. In such a case, the device may lose much of its gate-to-channel capacitance. Instead, depletion-mode MOS capacitors may be formed without extra processing steps through use of PMOS in PWELL or NMOS in NWELL transistors, depending on the native substrate type. These devices have limited utility as transistors because the source and drain are shorted, though they function well as loop filter capacitors when $V_{cntl}$ is close to the source-drain voltage.

For an NWELL process, it will often be preferable to use NMOS in NWELL devices as the loop filter capacitors. In NMOS in NWELL devices, the channel, source, and drain are all shorted to the substrate ($V_{ss}$), which may lead to jitter and noise susceptibility, due to the indirect coupling of the substrate into $V_{cntl}$.

Typically, the NMOS transistor body connection is connected to $V_{ss}$ to keep the body potential less than $V_{cntl}$ and keep the device in inversion. Referencing the control voltage to the ground ($V_{ss}$) rather than the positive supply ($V_{dd}$) requires that all connecting circuits expect the control input to be $V_{cntl}$-$V_{ss}$ rather than $V_{dd}$-$V_{cntl}$ to avoid adding $V_{dd}$ into the control input. To make the control input referenced to $V_{ss}$ (i.e., $V_{cntl}$-$V_{ss}$), all the relevant circuits should be flipped over from the $V_{dd}$-referenced configurations: PMOS exchanged for NMOS, $V_{dd}$ exchanged for $V_{ss}$, etc. However, if the VCO stage in FIG. 7 is flipped over, the input transistors become PMOS transistors, and some high frequency range may be lost.

FIGS. 12 and 13 respectively depict a VCO stage 240 and bias generator 260 for use with a $V_{ss}$-referenced control voltage $V_{cntl}$. The primary biasing signal produced by bias generator 260 is $V_{bc}$, and serves functions similar to those described above with respect to the previous embodiments. The secondary biasing signal is denoted $V_{bp}$, as before. In addition to being generated as shown in FIG. 13 (260), $V_{bp}$ can also be shorted to $V_{ss}$. In the depicted system, the VCO inputs connect to NMOS transistors so that no high frequency range is lost. Note that the body connections of PMOS transistors 242, 244, 246 and 248 have all been connected to the regulated power supply $V_{rs}$, which is possible because the PMOS is fabricated in an NWELL which is not electrically connected to the substrate. In contrast to the previous embodiments, the regulated VCO voltage is defined between $V_{rs}$, the regulated supply node for the VCO stages, and $V_{ss}$, such that the regulated VCO voltage is $V_{rs}$-$V_{ss}$. Similar to the previously discussed VCO stages, it will often be advantageous to short the $V_{rs}$ terminals of the individual stages together, to provide a regulated supply connection and cancel periodic resistance fluctuations in the individual stages. Both $V_{rg}$ (FIG. 7) and $V_{rs}$ may be considered a regulated voltage node of the respective oscillator configurations.

Figure 14:
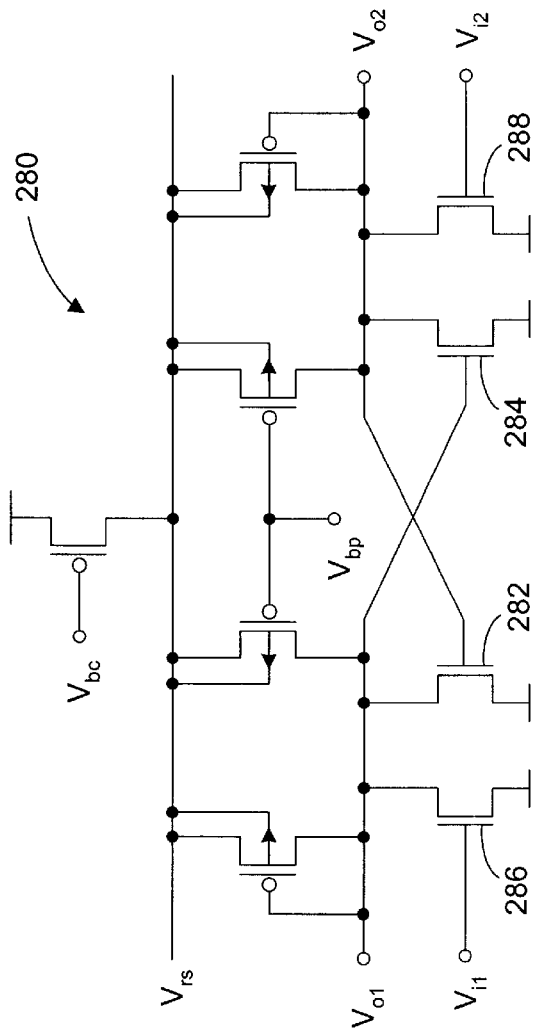
FIG. 14 depicts another embodiment of an oscillator stage that may employed in the voltage controlled oscillators of the invention.

FIG. 14 depicts a pseudo-differential implementation 280 of the VCO stage shown in FIG. 12. Typically, transistors 282 and 284 would be sized perhaps one-third the size of 286 and 288. The combined sizes of transistors 286 and 282 should equal the size of transistor 250 in FIG. 12.

Figure 15:
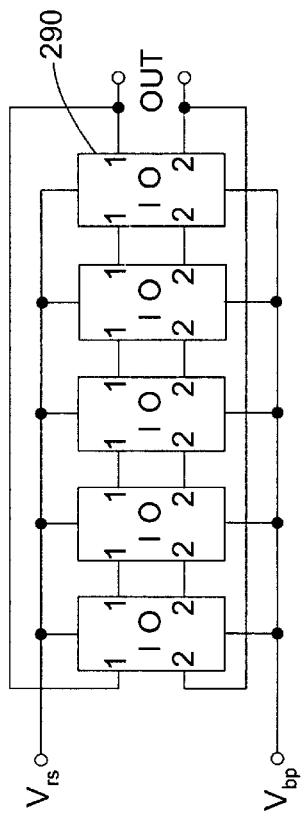
FIG. 15 depicts a multistage voltage controlled oscillator according to the invention, including a pseudo-differential stage.

FIG. 15 depicts a VCO ring made of four basic stages and a pseudo-differential stage 290. When used in this manner, the pseudo-differential stage keeps the phases of the two inverting rings of the VCO aligned opposite one another.

Co-pending U.S. patent application Ser. No. 10/259,913, by John G. Maneatis, entitled "Phase-Locked Loop with Composite Feedback Signal Formed From Phase-Shifted Variants of Output Signal," filed on Jan. 28, 2002, provides further examples of oscillator devices that may be employed with the present invention. The disclosure of that application is incorporated herein by this reference, in its entirety and for all purposes.

Figure 18:
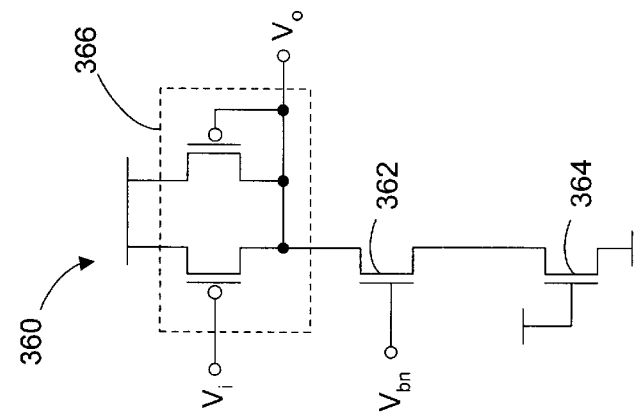
FIGS. 16–18 depict further embodiments of a charge pump, bias generator and oscillator stage according to the invention.
Figure 17:
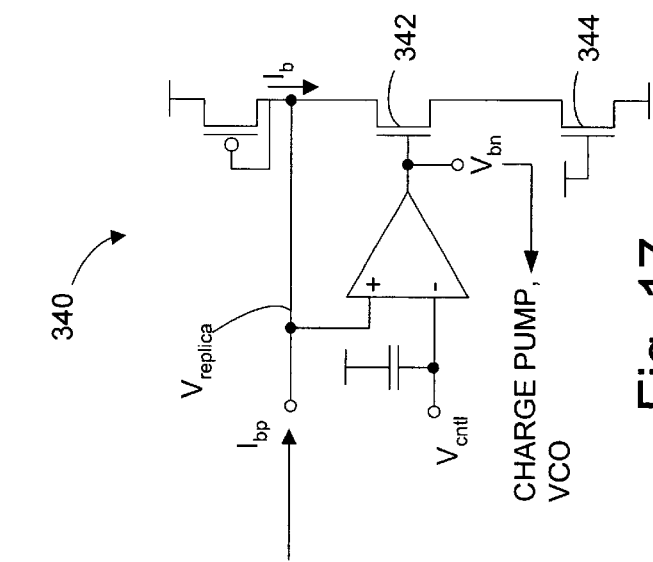
Figure 16:
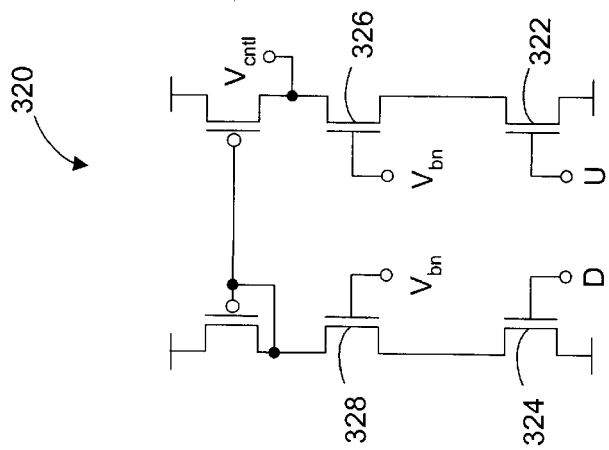

FIGS. 16, 17 and 18 respectively depict further alternate embodiments of a charge pump 320, bias generator 340 and VCO stage 360 according to the present invention. Referring first to charge pump 320, the charge pump includes transistors 322 and 324, which are respectively configured to receive the U and D signals from phase frequency detector 16. Transistors 322 and 324 are coupled in series between the $V_{ss}$ voltage supply rail and transistors 326 and 328, which are biased by $V_{bn}$ (or by mirrored copy $V_{bn}'$). Similar to the previously described embodiments, transistors 322 and 324 act as current switching devices, and control currents flowing through charge pump 320 in response to application of the U and D signals. As before, U pulses cause $V_{cntl}$ to fall, which leads to an increase in bias current $I_b$ in bias generator 340, an increase in biasing signal $V_{bn}$, an increase in the current supplied to the VCO, and an increase in the phase/frequency of the output signal generated by the VCO. D pulses, in contrast, cause decreases in the phase/frequency of the output signal generate by the VCO.

Referring now to FIGS. 17 and 18, the $V_{bn}$ current source transistors of bias generator 340 and VCO stage 360 (i.e., transistors 342 and 362) are coupled in series with devices that are matched to the switching transistors in charge pump 320 (i.e., transistors 322 and 324). Specifically, in bias generator 340, transistor 344 is matched to the charge pump switching transistors and is coupled in series between current source transistor 342 and the $V_{ss}$ supply rail. In VCO stage 360, current source 362 and transistor 364 are similarly configured. VCO stage 360 further includes a stage-coupled portion 366 having input and output terminals that are tied to adjacent VCO stages (not depicted).

The current source arrangement shown in FIGS. 16, 17 and 18 typically is replicated in all components of the phase-locked loop that employ a current source. For example, where charge pump isolation is employed, as discussed with reference to FIGS. 5 and 6, those components are also provided with a $V_{bn}$ biased current source and a matched transistor coupled in series between the current source and the $V_{ss}$ supply rail.

The matching of current sources and other components provides benefits similar to those discussed with reference to the previous embodiments. Matching of VCO stage 360 and bias generator 340 greatly increases the ability of the PLL system to reject supply noise by establishing a VCO bias current that is independent of supply and substrate voltage. Matching charge pump 320 and bias generator 340 balances operation of the charge pump when the system is in lock, to reduce or eliminate charge pump leakage and the phase offsets that can result from such leakage. The techniques previously discussed can be applied to the alternate embodiments in FIGS. 16, 17 and 18, including such techniques as charge pump input isolation, charge pump output isolation, and pseudo-differential ring structures.

Some PLL applications require a controlled amount of jitter in the output signal, so that the spectrum of emitted frequencies is spread over a small range rather than being concentrated at one peak. One way to accomplish this is to have the VCO frequency rise and fall over time, as depicted in FIG. 19.

To provide this controlled jitter, charge pump system 22 may include an offset charge pump 380 in addition to integrating charge pump 40 proportional charge pump 90, as seen in FIG. 18. Offset charge pump 380 contributes an oscillatory component to the charge pump output stored at $V_{cntl}$, while integrating charge pump 40 operates as previously described to contribute a constant component to $V_{cntl}$.

This arrangement will cause the frequency to oscillate appropriately so long as the loop bandwidth of the PLL is low enough that the other charge pumps cannot cancel the output of the offset charge pump. In typical implementations, the charge pump currents should be scaled so that the offset charge pump currents are larger than the currents provided by the other charge pumps.

Figures 19, 20:
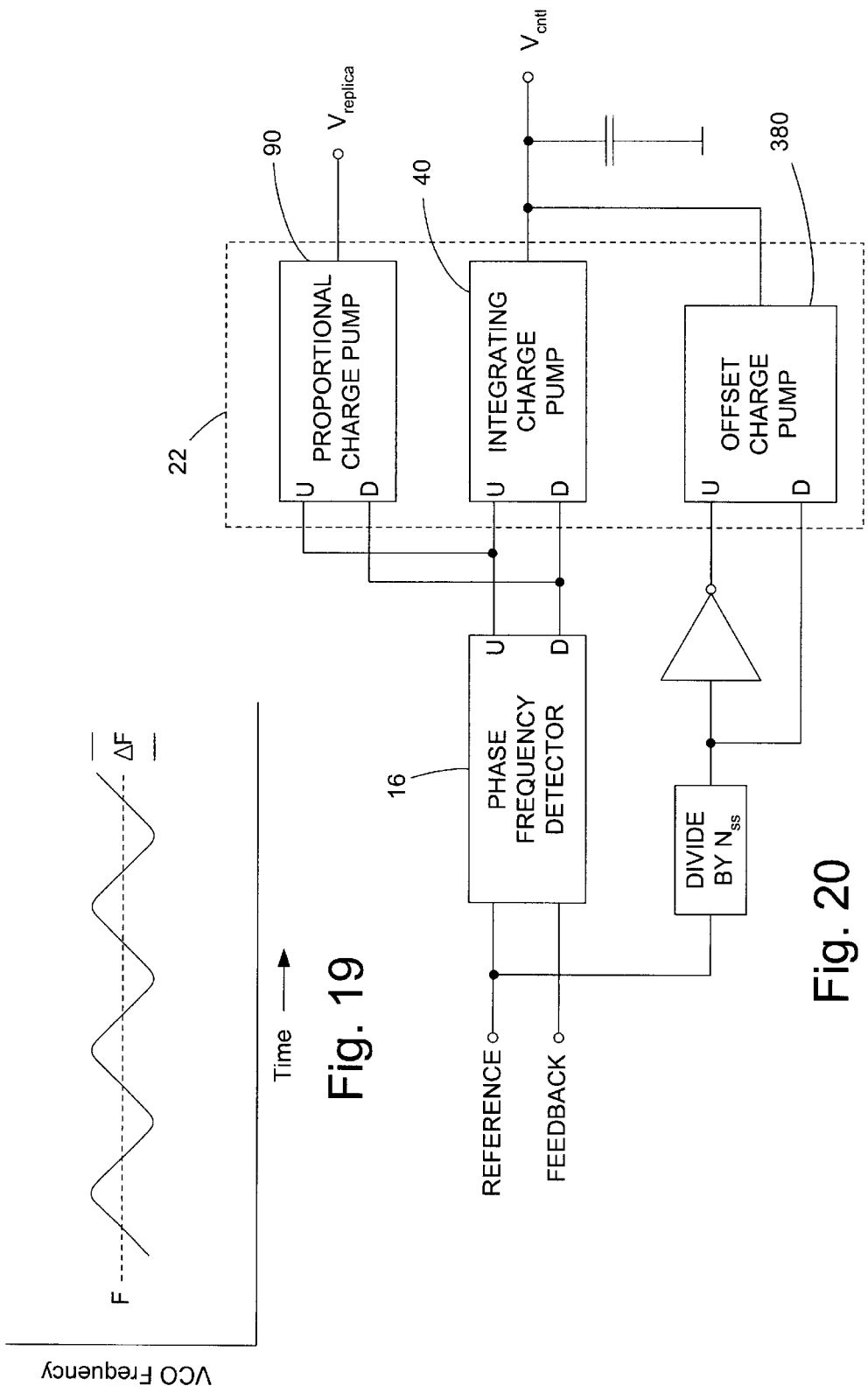
FIG. 19 is a frequency versus time plot which illustrates the output behavior of a spread spectrum phase-locked loop according to the present invention.
FIG. 20 is a diagram depicting an alternate charge pump system configured to provide spread spectrum output.

Normally, it will be desirable that output oscillations occur within a relatively small and controlled frequency range ΔF that is centered about the target (desired) output frequency (FIG. 19). In a PLL system such as that described above, ΔF can be controlled by adjustment of the ratio between two capacitances, provided the offset charge pump current is proportional to the integrating charge pump current. The relationship between ΔF and F is specified by the following: $\Delta F/F=(N_{ss}/4)(I_{ss}/I_b)(C_b/C1)$, where $N_{ss}$ is the number of reference cycles over which a full rise and fall of the generated frequency is to occur, $I_{ss}$ is the current in the offset charge pump, $I_b$ is the current in the integrating charge pump, $C_b$ is the effective capacitance of the VCO stages, and C1 is the capacitor that the integrating charge pump drives. The ratios on the right hand side of the equation can be well controlled at design time to allow adjustment of the relationship between ΔF and F.

From the above, it should be appreciated that offset charge pump 380 may be considered a variable subsystem of charge pump system 22, while charge pumps 40 and 90 may be considered a constant subsystem. When implemented together, the combined operation of the variable subsystem and constant subsystem cause the PLL output to tend toward and oscillate about the desired output frequency. Furthermore, the variable subsystem typically is designed to allow precise control over the maximum and minimum output frequencies.

While the present invention has been particularly shown and described with reference to the foregoing preferred embodiments, those skilled in the art will understand that many variations may be made therein without departing from the spirit and scope of the invention as defined in the following claims. The description of the invention should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

I claim:

1. A phase-locked loop configured to produce an output signal and cause the output signal to tend toward a desired output frequency based on an applied reference signal, comprising:

a bias generator configured to generate a biasing current and an associated biasing signal based on differences between the output signal and the desired output frequency, where the biasing current produces a regulated bias generator voltage within the bias generator; and a voltage controlled oscillator operatively coupled with the bias generator and configured to produce the output signal in response to a VCO current generated via application of the biasing signal from the bias generator, where the VCO current produces a regulated VCO voltage within the voltage controlled oscillator, and where the bias generator is configured so that the regulated bias generator voltage matches the regulated VCO voltage free of any direct coupling between the bias generator and the regulated VCO voltage.

2. The phase-locked loop of claim 1, further comprising a loop filter coupled within an integrating control path of the phase-locked loop, the loop filter including a capacitance formed by an NMOS in NWELL device.

3. The phase-locked loop of claim 1, where the bias generator is configured to dynamically generate the biasing signal free of any predetermined external bias.

4. The phase-locked loop of claim 1, where the bias generator is configured to generate the biasing current and biasing signal based on a supply-referenced voltage, such that the biasing current and VCO current are substantially independent of supply and substrate noise.

5. The phase-locked loop of claim 1, further comprising a charge pump system configured to pump charge to the bias generator based on differences between the output signal and the desired output frequency, where the bias generator is configured to apply the biasing signal to the charge pump system to bias a current source of the charge pump system.

6. The phase-locked loop of claim 5, where the biasing signal is coupled into the charge pump system via an isolated bias input path configured to inhibit undesired signal coupling from the charge pump system to the voltage controlled oscillator via the biasing signal.

7. The phase-locked loop of claim 5, where the charge pump system includes a constant subsystem configured to generate a steady state output and a variable subsystem configured to generate a variable output.

8. The phase-locked loop of claim 1, where the voltage controlled oscillator includes a plurality of VCO stages.

9. The phase-locked loop of claim 8, where at least one of the VCO stages is a pseudo-differential stage.

10. The phase-locked loop of claim 8, where the VCO stages are coupled in parallel between a positive voltage supply and a regulated ground node.

11. The phase-locked loop of claim 10, where the VCO current is produced by a VCO current source that is biased by the biasing signal, and where the VCO current source is coupled in series between a negative voltage supply and the regulated ground node.

12. The phase-locked loop of claim 8, where the VCO stages are coupled in parallel between a negative voltage supply and a regulated supply node.

13. The phase-locked loop of claim 12, where the VCO current is produced by a VCO current source that is biased by the biasing signal, and where the VCO current source is coupled in series between a positive voltage supply and the regulated supply node.

14. A phase-locked loop configured to produce an output signal and cause the output signal to tend toward a desired output frequency based on an applied reference signal, comprising:
a charge pump system configured to pump charge based on differences between the output signal and the desired output frequency; and
a voltage controlled oscillator operatively coupled with charge pump system, where the voltage controlled oscillator is driven based on output applied from the charge pump system,
where the charge pump system and voltage controlled oscillator are configured to be driven at least partially in response to application of a shared biasing signal which is generated based on detected differences between the output signal and the desired output frequency, and where the biasing signal is coupled into the charge pump system via an isolated input path configured to inhibit undesired signal coupling from the charge pump system to the voltage controlled oscillator via the shared biasing signal.

15. The phase-locked loop of claim 14, where the isolated input path includes a current mirror configured to produce a mirrored copy of the biasing signal for use within the charge pump system.

16. The phase-locked loop of claim 14, further comprising a bias generator configured to dynamically generate the biasing signal free of any predetermined external bias.

17. The phase-locked loop of claim 14, where the voltage controlled oscillator includes a current source and a plurality of VCO stages connected to the current source via a regulated voltage node, the voltage controlled oscillator being configured to produce the output signal based upon current supplied via the regulated voltage node to the plurality of VCO stages.

18. The phase-locked loop of claim 17, where the current supplied to the plurality of VCO stages varies with the biasing signal.

19. The phase-locked loop of claim 14, where the charge pump system includes a constant subsystem configured to generate a steady state component of the charge pump output and a variable subsystem configured to generate a variable component of the charge pump output, and where combined operation of the constant subsystem and variable subsystem causes the output signal to tend toward and oscillate about the desired output frequency in a controlled frequency range.

20. The phase-locked loop of claim 14, where the biasing signal is generated by a bias generator that matches an effective impedance of the voltage controlled oscillator so that current supplied to the voltage controlled oscillator is substantially independent of supply and substrate noise.

21. A phase-locked loop configured to produce an output signal and cause the output signal to tend toward a desired output frequency based on an applied reference signal, comprising:
a charge pump configured to pump charge based on differences detected between the output signal and the desired output frequency;
a voltage controlled oscillator; and
a bias generator configured to generate a biasing signal via operation of a feedback loop responsive to charge pumped by the charge pump, where the voltage controlled oscillator is configured to produce the output signal in response to application of the biasing signal,
where charge pump output is applied to the bias generator along a proportional control path and an integrating control path, the proportional control path including a current mirror isolation mechanism to prevent capacitance on the proportional control path from affecting dynamic response of the bias generator feedback loop.

22. The phase-locked loop of claim 21, where the voltage controlled oscillator includes a current source and a plurality of VCO stages connected to the current source via a regulated voltage node, the voltage controlled oscillator being configured to produce the output signal based upon current supplied via the regulated voltage node to the plurality of VCO stages.

23. The phase-locked loop of claim 22, where at least one of the plurality of VCO stages is a differential stage.

24. The phase-locked loop of claim 22, where at least one of the plurality of VCO stages is a pseudo-differential stage.

25. The phase-locked loop of claim 22, where the bias generator matches an effective impedance of the voltage controlled oscillator so that current supplied to the voltage controlled oscillator is substantially independent of supply and substrate noise.

26. The phase-locked loop of claim 21, where the bias generator is configured to dynamically generate the biasing signal free of any predetermined external bias.

27. A phase-locked loop configured to produce an output signal and cause the output signal to tend toward a desired output frequency based on an applied reference signal, comprising:
 a voltage controlled oscillator;
 a charge pump system configured to pump charge based on differences between the output signal and the desired output frequency, the charge pump system including:
  a constant subsystem configured to generate a steady state output; and
  a variable subsystem configured to generate a variable output; and
 a bias generator configured to generate a dynamic biasing signal in response to charge pumped by the charge pump system, where the voltage controlled oscillator is configured to produce the output signal in response to application of the dynamic biasing signal, the charge pump system being configured so that combined operation of the constant subsystem and variable subsystem causes the output signal to tend toward and oscillate about the desired output frequency in a controlled frequency range,
 where the charge pump system includes a current source biased by the dynamic biasing signal.

28. The phase-locked loop of claim 27, where the bias generator is configured to generate the dynamic biasing signal free of any predetermined external bias.

29. The phase-locked loop of claim 27, where the dynamic biasing signal is coupled into the charge pump system via an isolated bias input path configured to inhibit undesired signal coupling from the charge pump system to the voltage controlled oscillator via the dynamic biasing signal.

30. The phase-locked loop of claim 27, where the voltage controlled oscillator includes a plurality of VCO stages.

31. The phase-locked loop of claim 30, where at least one of the VCO stages is a pseudo-differential stage.

32. The phase-locked loop of claim 30, where the VCO stages are coupled in parallel between a positive voltage supply and a regulated ground node.

33. The phase-locked loop of claim 32, where the voltage controlled oscillator is configured to be driven by a current source that is biased by the dynamic biasing signal, and where the current source is coupled in series between a negative voltage supply and the regulated ground node.

34. The phase-locked loop of claim 30, where the VCO stages are coupled in parallel between a negative voltage supply and a regulated supply node.

35. The phase-locked loop of claim 34, where the voltage controlled oscillator is configured to be driven by a current source that is biased by the dynamic biasing signal, and where the current source is coupled in series between a positive voltage supply and the regulated supply node.

36. A phase-locked loop configured to produce an output signal and cause the output signal to tend toward a desired output frequency based on an applied reference signal, comprising:
 a charge pump system configured to pump and store a charge pump output based on differences between the output signal and the desired output frequency, the charge pump system including:
  a constant subsystem configured to generate a steady state component of the charge pump output; and
  a variable subsystem configured to generate a variable component of the charge pump output; and
 a voltage controlled oscillator operatively coupled with the charge pump and configured to be driven in response to the charge pump output, including a current source and a plurality of VCO stages connected to the current source via a regulated voltage node, the voltage controlled oscillator being configured to produce the output signal based upon current supplied via the regulated voltage node to the plurality of VCO stages, where the current supplied to the VCO stages varies with the charge pump output.

37. A phase-locked loop configured to produce an output signal and cause the output signal to tend toward a desired output frequency based on an applied reference signal, comprising:
 a charge pump configured to pump charge based on variation of the output signal from the desired output frequency, the charge pump including a charge pump current source and a switching device coupled in series between the charge pump current source and a voltage supply, the switching device being configured to receive error signals from an error detector; and
 a multistage voltage controlled oscillator configured to produce the output signal based on the charge pumped by the charge pump, where each stage of the voltage controlled oscillator includes:
  a stage-coupled portion having an input and an output tied to corresponding terminals of adjacent oscillator stages;
  a semiconductor device which is matched to the switching device of the charge pump; and
  a VCO current source matched to the charge pump current source, where the semiconductor device is coupled in series between the VCO current source and the voltage supply.

38. The phase-locked loop of claim 37, where the charge pump and voltage controlled oscillator are biased via application of a shared biasing signal, and where the shared biasing signal is applied to the charge pump via an isolated bias input path configured to inhibit undesired signal coupling from the charge pump to the voltage controlled oscillator via the shared biasing signal.

39. A phase-locked loop configured to produce an output signal and cause the output signal to tend toward a desired output frequency based on an applied reference signal, comprising:
 a charge pump system configured to pump charge based on differences between the output signal and the desired output frequency; and
 a voltage controlled oscillator configured to produce the output signal based on a VCO current generated through operation of a dynamic bias generator operatively coupled with the charge pump system and voltage controlled oscillator, the bias generator being responsive to charge pumped from the charge pump system,
 where the charge pump system includes semiconductor components that correspond to only a portion of the voltage controlled oscillator and that are selected to provide the charge pump system with an effective impedance that is matched to an effective impedance of the voltage controlled oscillator, and where the bias generator is configured to use the effective charge pump impedance to bias the charge pump system and thereby produce within the charge pump system a charge pump current of equal density to the VCO current.

40. The phase-locked loop of claim 39, where the charge pump system is configured to pump charge based on increase and decrease signals received from an error detector, the error detector being configured to simultaneously apply increase and decrease signals to the charge pump system when the output signal has substantially locked onto the desired output frequency.

41. The phase-locked loop of claim 40, where the bias generator is configured to bias the charge pump system so that the charge pump system pumps no net charge upon simultaneous application of increase and decrease signals to the charge pump system.

42. The phase-locked loop of claim 39, where the bias generator is configured so that the VCO current produced through operation of the bias generator is substantially independent of supply and substrate noise.

* * * * *

UNITED STATES PATENT AND TRADEMARK OFFICE
CERTIFICATE OF CORRECTION

PATENT NO.      : 6,710,670 B2                                    Page 1 of 1
DATED           : March 23, 2004
INVENTOR(S)     : John George Maneatis It is certified that error appears in the above-identified patent and that said Letters Patent is hereby corrected as shown below:

<u>Title page,</u>
Item [56], References Cited, U.S. PATENT DOCUMENTS, insert the following:

| | | |
|---|---|---|
| 4,608,530 | 8/26/86 | Bacrania |
| 4,644,536 | 2/17/87 | Utsumi |
| 4,792,768 | 12/20/88 | Fried et al. |
| 5,043,677 | 8/27/91 | Tomassetti et al. |
| 5,144,156 | 9/1/92 | Kawasaki |
| 5,285,114 | 2/8/94 | Atriss et al. |
| 5,375,148 | 12/20/94 | Parker et al. |
| 5,508,660 | 4/16/96 | Gersbach et al. |
| 5,512,816 | 4/30/96 | Lambert |
| 5,629,650 | 5/13/97 | Gersbach et al. |
| 5,687,201 | 11/11/97 | McClellan et al. |
| 5,705,947 | 1/6/98 | Jeong |
| 5,727,037 | 3/10/98 | Maneatis |
| 5,731,696 | 3/24/98 | Pennisi et al. |
| 5,757,238 | 5/26/98 | Ferraiolo et al. |
| 5,870,003 | 2/9/99 | Boerstler |
| 5,880,579 | 3/9/99 | Wei et al. |
| 5,900,784 | 5/4/99 | O'Sullivan |
| 5,945,855 | 8/31/99 | Momtaz |
| 5,959,502 | 9/28/99 | Ovens et al. |
| 5,986,485 | 11/16/99 | O'Sullivan |
| 6,011,822 | 1/4/00 | Dreyer |
| 6,043,695 | 3/28/00 | O'Sullivan |
| 6,043,715 | 3/28/00 | Bailey et al. |
| 6,054,882 | 4/25/00 | Izumikawa |
| 6,067,336 | 5/23/00 | Peng |
| 6,075,406 | 6/13/00 | Lee et al. |
| 6,107,849 | 8/22/00 | Williams et al. |
| 6,107,889 | 8/22/00 | Strange et al. |
| 6,111,470 | 8/29/00 | Dufour |
| 6,118,346 | 9/12/00 | Olgaard |
| 6,124,741 | 9/26/00 | Arcus |
| 6,124,755 | 9/26/00 | Parker et al. |
| 6,181,210 | 1/30/01 | Wakayama |
| 6,201,380 | 3/13/01 | Tsujino et al. |
| 6,215,363 | 4/10/01 | Conta et al. |
| 6,222,421 | 4/24/01 | Kiyose |
| 6,242,897 | 6/5/01 | Savage et al. |
| 6,262,610 | 7/17/01 | Lo et al. |
| 6,265,859 | 7/24/01 | Datar et al. |
| 6,275,097 | 8/14/01 | Liang et al. |
| 6,326,852 | 12/4/01 | Wakayama |
| 6,329,882 | 12/11/01 | Fayneh et al. |

Signed and Sealed this

Sixth Day of July, 2004

JON W. DUDAS
*Acting Director of the United States Patent and Trademark Office*